United States Patent [19]

Park et al.

[11] Patent Number: 5,717,719
[45] Date of Patent: Feb. 10, 1998

[54] DIGITAL RADIO TRANSMISSION-RECEPTION APPARATUS

[75] Inventors: Jae-Sun Park, Ahnsan; Jae-Min Lee, Seoul, both of Rep. of Korea

[73] Assignee: SamSung Electronics Co., Ltd., Suwon, Rep. of Korea

[21] Appl. No.: 380,948

[22] Filed: Jan. 31, 1995

[30] Foreign Application Priority Data

Sep. 10, 1994 [KR] Rep. of Korea ............... 1994-22857

[51] Int. Cl.$^6$ ............................................. H04B 1/40
[52] U.S. Cl. ..................... 375/298; 375/219; 375/261; 455/118; 332/103
[58] Field of Search ................... 332/103, 104, 332/105; 455/75, 76, 113, 118, 119, 20, 22; 375/219, 261, 295, 298, 307, 316, 324, 326, 340, 346, 306; 331/11; 370/280

[56] References Cited

U.S. PATENT DOCUMENTS

| | | |
|---|---|---|
| 3,984,634 | 10/1976 | Painter . |
| 4,384,357 | 5/1983 | DeBuda et al. ............ 375/81 |
| 4,464,770 | 8/1984 | Maurer . |
| 4,594,725 | 6/1986 | Deperben . |
| 4,606,048 | 8/1986 | Sasaki . |
| 4,630,283 | 12/1986 | Schiff . |
| 4,669,091 | 5/1987 | Nossen . |
| 4,672,629 | 6/1987 | Beier . |
| 4,701,935 | 10/1987 | Namiki . |
| 4,761,795 | 8/1988 | Beier . |
| 4,942,592 | 7/1990 | Leitch . |
| 5,124,672 | 6/1992 | Kuisma ............ 332/103 |
| 5,126,998 | 6/1992 | Stem . |
| 5,271,041 | 12/1993 | Montreuil . |
| 5,293,406 | 3/1994 | Suzuki . |
| 5,309,429 | 5/1994 | Fukuda ............ 370/29 |
| 5,319,799 | 6/1994 | Morita ............ 455/78 |
| 5,483,679 | 1/1996 | Sasaki ............ 455/86 |
| 5,548,825 | 8/1996 | Maemura et al. ............ 455/115 |

*Primary Examiner*—Wellington Chin
*Assistant Examiner*—Jean B. Corrielus
*Attorney, Agent, or Firm*—Robert E. Bushnell, Esq.

[57] ABSTRACT

A transmission-reception apparatus in a digital radio communication system for minimizing electrical interference within the apparatus by eliminating interference attributable to the use of different frequency generators. The transmission apparatus includes an antenna, a quadrature modulator for quadrature modulating first and second data to be input, an up-converter for increasing a frequency of the quadrature modulated signal to a transmission frequency band and then for supplying the resulting signal to the antenna, a reference frequency generator, a carrier frequency generator for generating a carrier frequency for modulation by being phase-locked with the reference frequency generator, and a frequency multiplier for generating a respective local oscillation frequency for up-conversion by multiplying the carrier frequency by a predetermined positive number. Up-conversion of the quadrature-modulated signal can be performed in a single stage or in a plurality of stages.

20 Claims, 2 Drawing Sheets

DIGITAL RADIO TRANSMISSION-RECEPTION APPARATUS

CROSS-REFERENCE TO RELATED APPLICATIONS

This application makes reference to, incorporates herein and claims all benefits accruing from our application earlier filed in the Korean Industrial Property Office 10 Sep. 1994 of our application entitled DIGITAL RADIO TRANSMISSION-RECEPTION APPARATUS, which application was assigned Serial No. 22857/1994.

BACKGROUND OF THE INVENTION

The present invention relates to a transmission-reception apparatus in a digital radio communication system, and more particularly to a digital radio transmission-reception apparatus for minimizing electrical interference within the apparatus by eliminating interference attributable to the use of different frequency generators.

Typically, in a digital radio communication system such as a local area radio network, data is quadrature-modulated and then transmitted. Quadrature modulation is a method for modulating data using two different carrier waves, wherein the carrier wave frequencies have a phase difference of 90°, and then combining the two carrier waves. In these types of systems, a carrier frequency generator for quadrature-modulating input signals and a local oscillation frequency generator for increasing the frequency of the modulated signals to a transmission frequency band are typically required to effectively enable signal transmission. The requirement for a separate local oscillation frequency generator and carrier frequency generator can cause problems, however, due to electrical interference between the two frequency generators. Other factors, also, can limit the dependability of communication systems.

One particular type of radio communication system is disclosed in U.S. Pat. No. 5,126,998 entitled Method And Apparatus For Transmitting And Receiving A Carrier Signal Which Is Simultaneously Frequency And Phase Modulated issued to Stem, Jr. on 30 Jun. 1992. In this invention, a carrier signal is simultaneously frequency and phase modulated to provide an output frequency and phase modulated carrier. Since frequency and phase modulation are related to one another, and therefore interfere with each other, I believe that this type of system can be improved upon to provide a more reliable, interference-free system.

Another type of communication system is disclosed in U.S. Pat. No. 5,271,041 entitled Method And Apparatus For QPR Carrier Recovery issued to Montreuil on 14 Dec. 1993. Here, a 30 channel digital bit stream is demultiplexed into six groups of five channels, wherein each group of channels thereafter modulates a carrier by a quadrature partial response (QPR) process. The QPR signal is then transmitted over a cable system to a plurality of subscribers. While this type of system purports to provide a high bit rate transfer with a low bandwidth, I still believe a more simplistic and desirable system design can be achieved.

SUMMARY OF THE INVENTION

It is therefore an object of the present invention to provide an improved digital radio transmission-reception apparatus.

It is another object to provide a digital radio transmission-reception apparatus which can be produced at a reduced cost.

It is still another object to provide a digital radio transmission-reception apparatus which does not use an additional local oscillation frequency generator.

It is yet another object to provide a digital radio transmission-reception apparatus which can minimize interference within the apparatus by eliminating interference attributable to using different frequency generators.

To achieve these above objects, a digital radio transmission-reception apparatus constructed according to the principles of the present invention comprises a digital radio signal transmission device having a quadrature modulation device for quadrature-modulating first and second input signals, a plurality of mixers for increasing the frequency of the quadrature-modulated signals to a transmission frequency band by mixing the quadrature-modulated signals with local oscillation frequencies, carrier frequency generation devices for generating a carrier frequency by being phase-locked in a reference frequency and providing the carrier frequency to the quadrature modulation device, and a control device for multiplying the carrier frequency by a predetermined positive number to generate respective local oscillation frequencies for driving the mixers.

The control device has a local oscillation frequency generation device for each mixer used. The local oscillation frequency generation device comprises a frequency multiplier for multiplying the carrier frequency by the predetermined positive number, a filter for extracting only necessary frequency components from the multiplied signal, and an amplifier for amplifying the filtered signal to a level where the corresponding mixer can be driven. It is also plausible to include filter devices between the quadrature modulation device and the first mixer, and between successive mixers.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
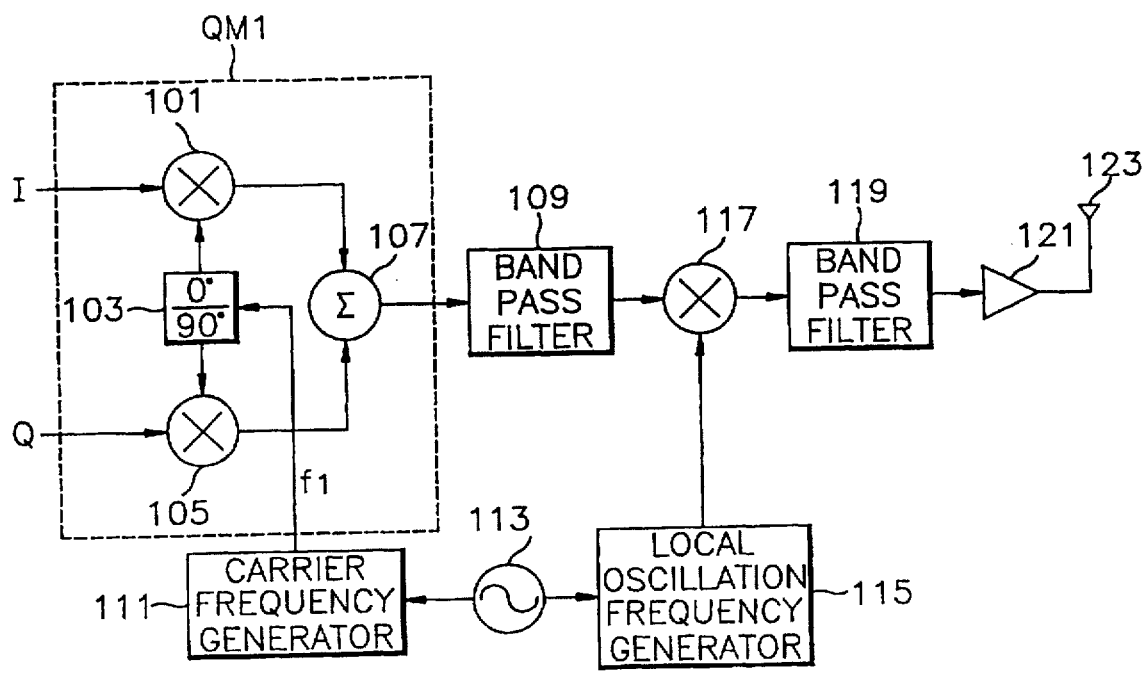
FIG. 1 is a diagram illustrating construction of a conventional digital radio transmission apparatus.

Referring to FIG. 1, an embodiment of a conventional radio transmission apparatus having a quadrature modulation circuit QM1 is illustrated.

In FIG. 1, first and second data I and Q are input to first and second mixers 101 and 105, respectively, within quadrature modulation circuit QM1. First and second mixers 101 and 105 modulate first and second data I and Q, respectively, and then supply the modulated data to a combiner 107. During this time, first and second mixers 101 and 105 receive signals having a 0° phase and a 90° phase, respectively, which are generated by dividing a signal having a first frequency $f_1$ into 0° and 90° phases at a phase shifter 103. First frequency $f_1$ is generated from a carrier frequency generator 111 which is phase-locked with a reference frequency generator 113.

Combiner 107 combines the modulated data and then outputs a quadrature-modulated signal. The quadrature modulated signal passes through a band pass filter 109. Accordingly, only a selected frequency band of the quadrature modulated signal is filtered. The filtered signal output from band pass filter 109 is then transmitted to a mixer 117. Mixer 117 increases the frequency of the filtered signal to a transmission frequency band. Mixer 117 receives a second frequency $f_2$ signal generated from a local oscillation frequency generator 115 which is also phase-locked with reference frequency generator 113. The frequency of the filtered signal output from band pass filter 109 is shifted according to second frequency signal $f_2$. A resulting signal is output from mixer 117 and is passed through a band pass filter 119. Accordingly, only a selected frequency band of the resulting signal passes to an amplifier 121 and is transmitted through an antenna 123.

As discussed previously, the transmission system described above requires two separate frequency generators, namely, carrier frequency generator 111 for quadrature-modulating data and local oscillation frequency generator 115 for increasing signal frequency to a level necessary for transmission. With this type of system, however, many problems exist. First, the frequency generated by local oscillation frequency generator 115 is typically very high. Therefore, the oscillator for generating the local oscillation frequency and a circuit for phase-locking the oscillator are expensive. Secondly, such a system is disadvantageous due to electrical interference between the different frequency generators within the system. To rectify this problem, a technique for removing the interference must be provided; in turn, costs are increased.

Figure 2:
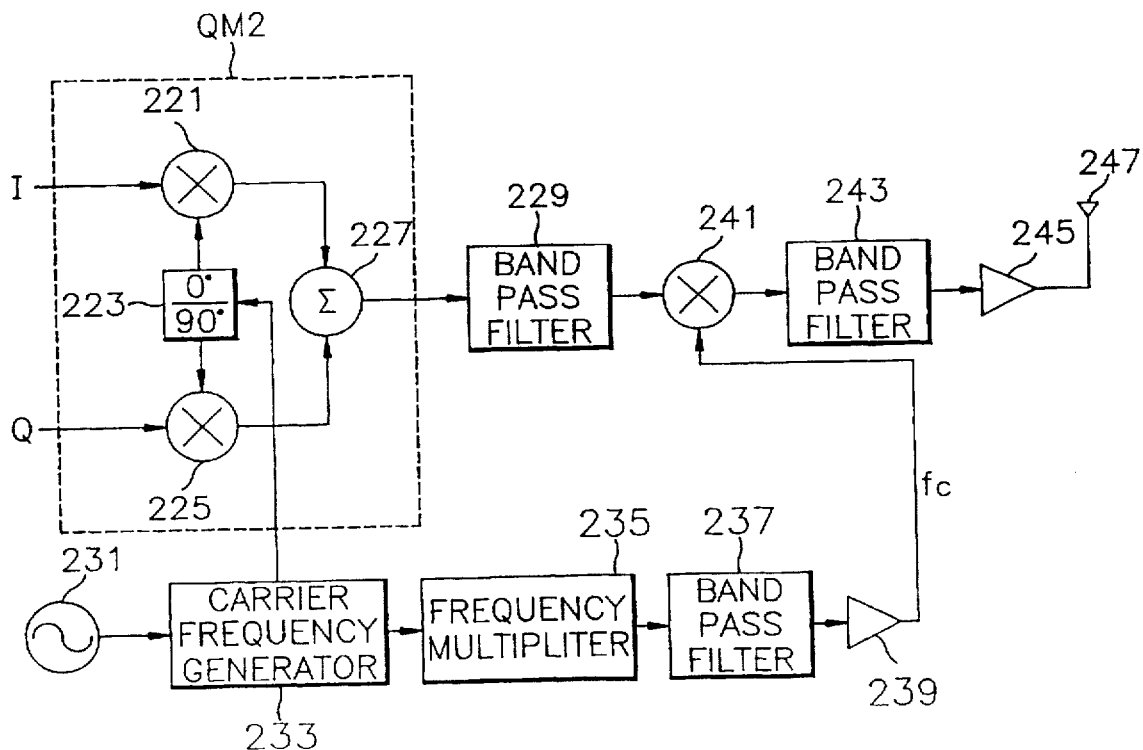
FIG. 2 is a diagram illustrating a digital radio transmission apparatus constructed according to the principles of the present invention.

FIG. 2 is a diagram illustrating a digital radio transmission apparatus constructed according to the principles of the present invention. The digital radio transmission apparatus eliminates the need for a local frequency generation source within the apparatus by using a carrier frequency multiplied by N (wherein N is positive number) for quadrature modulation.

In FIG. 2, first and second data I and Q are input to first and second mixers 221 and 225, respectively, within a quadrature modulation circuit QM2. First and second mixers 221 and 225 modulate first and second data I and Q, respectively, and then supply the modulated signal to a combiner 227. During this time, first and second mixers 221 and 225 receive signals having a 0° phase and a 90° phase, respectively, which are generated by dividing a signal having a frequency $f_m$ into 0° and 90° phases at phase shifter 223. The frequency $f_m$ is generated from a carrier frequency generator 233 which is phase-locked with a reference frequency generator 231.

Combiner 227 combines the modulated data and then outputs a quadrature-modulated signal. The quadrature-modulated signal passes through a band pass filter 229. Accordingly, only a selected frequency band of the quadrature-modulated signal is filtered. The filtered signal output from band pass filter 229 is then transmitted to a mixer 241. Mixer 241 increases (i.e. up-converts) the frequency of the filtered signal to a frequency band necessary for transmission. An up-converting frequency $f_c$ for increasing the frequency of the filtered signal is supplied to mixer 241. Up-converting frequency $f_c$ is generated by multiplying the frequency $f_m$ used in modulation by N with a frequency multiplier 235, filtering the output through a band pass filter 237, and then amplifying the output of band pass filter 237 via an amplifier 239 to a level necessary to drive mixer 241.

In this manner, mixer 241 is driven by a signal having up-converting frequency $f_c$, thereby increasing the frequency of the signal output from band pass filter 229 to a frequency band necessary for transmission. Thereafter, an output signal from mixer 241 is passed through a band pass filter 243 and then transmitted through an antenna 247 via an amplifier 245.

Figure 3:
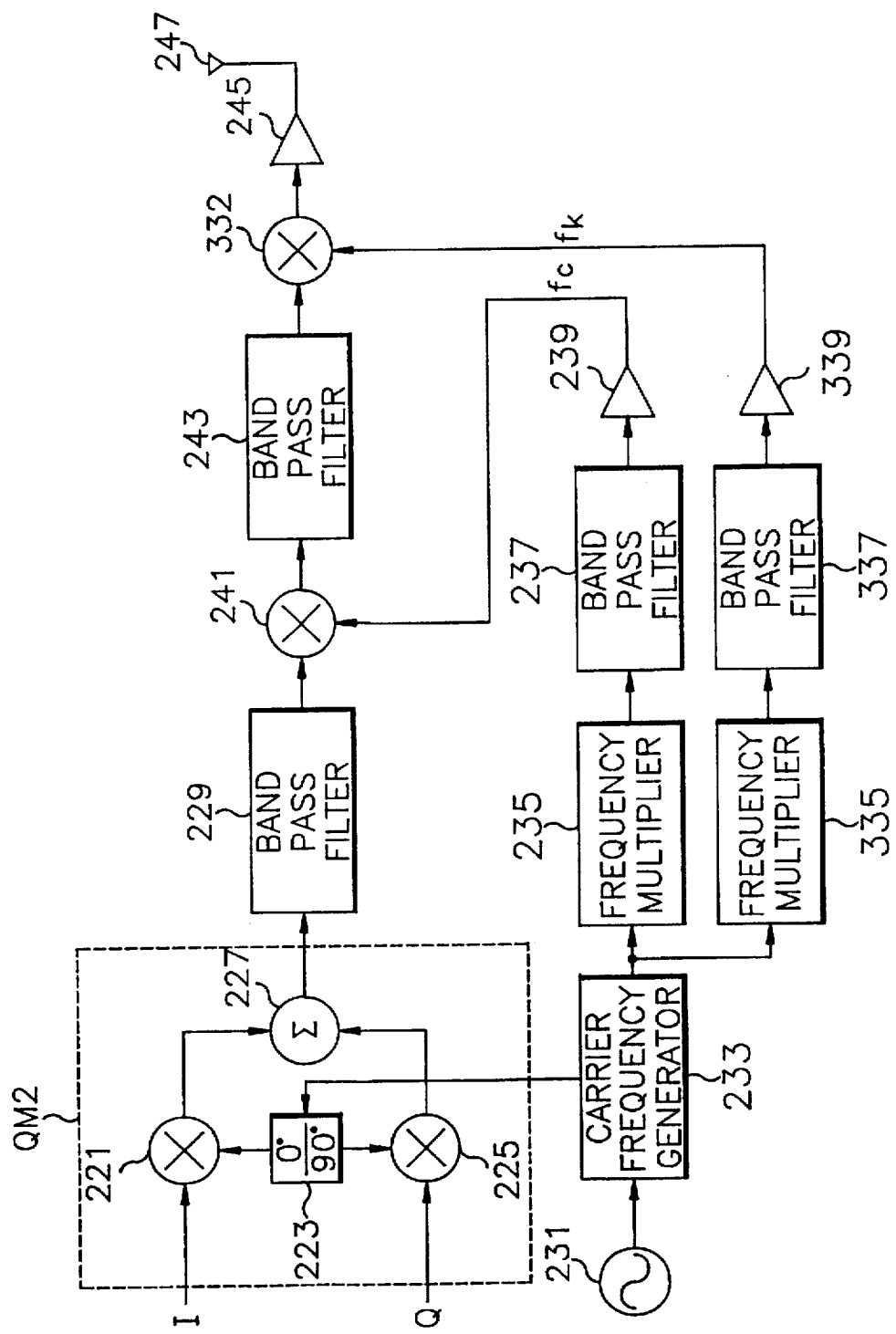
FIG. 3 is a diagram illustrating another embodiment of a digital radio transmission apparatus constructed according to the principles of the present invention.

Referring now to FIG. 3, another embodiment of the present invention is illustrated. The apparatus of FIG. 3 performs a dual up-conversion operation. This operation is especially useful when there is a large difference between a frequency generated by the carrier frequency generator and a final transmission frequency. Those elements in FIGS. 2 and 3 having common reference numerals are the same. The embodiment FIG. 2 is modified in FIG. 3 by the addition of a mixer 332 connected between band pass filter 243 and amplifier 245. Also in FIG. 3, a frequency multiplier 335, a band pass filter 337 and an amplifier 339 are connected between carrier frequency generator 233 and mixer 332 to supply a signal having an up-converting frequency $f_k$ to mixer 332. That is, the carrier frequency used in modulation is multiplied by N via frequency multipliers 235 and 335 (each multiplier can use either the same or a different N). As in the embodiment of FIG. 2, the output of frequency multiplier 235 is then filtered, amplified and provided at up-converting frequency $f_c$ to mixer 241. Similarly, the output of frequency multiplier 335 is filtered by band pass filter 337, amplified by amplifier 339 and provided at up-converting frequency $f_k$ to mixer 332. Accordingly, an increase in the frequency of a modulated signal can be performed a plurality of times prior to transmission.

It will be intuitive to those skilled in the art that an apparatus capable of performing up-conversion any number of times (i.e. 3, 4, 5 . . . ) can be easily constructed from this disclosure. Moreover, although the preceding disclosure describes and illustrates only a transmission apparatus, the principles of the present invention can be easily applied to a reception apparatus by reverse construction.

As described above, the present invention is advantageous in that system performance is improved by minimizing electrical interference within the apparatus by eliminating interference attributable to using different frequency generators. Furthermore, the present invention can be constructed without an additional local oscillation frequency generator and accompanying phase-locked loop. Accordingly, the present invention provides a cost advantage over conventional systems.

What is claimed is:

1. A digital radio transmission apparatus, comprising:
    an antenna;
    means for quadrature-modulating first and second input signals to generate a quadrature-modulated signal;
    means for increasing a frequency of said quadrature-modulated signal to a transmission frequency band to generate a high frequency quadrature-modulated signal, and then supplying said high frequency quadrature-modulated signal to said antenna;
    means for generating a carrier frequency and for providing said carrier frequency to said quadrature-modulating means; and
    means for generating a local oscillation frequency to drive said frequency increasing means, by multiplying said carrier frequency by a predetermined positive number.

2. The transmission apparatus as claimed in claim 1, wherein said local oscillation frequency generating means further comprise:
    means for multiplying said carrier frequency by said predetermined positive number to generate a multiplied signal;

means for filtering said multiplied signal to generate a filtered signal; and means for amplifying said filtered signal to a level necessary to drive said frequency increasing means.

3. The transmission apparatus as claimed in claim 2, wherein said filtering means comprise a band pass filter.

4. The transmission apparatus as claimed in claim 1, further comprising means for filtering said quadrature-modulated signal to generate a filtered signal, and then providing said filtered signal to said frequency increasing means.

5. The transmission apparatus as claimed in claim 1, further comprising:

means for filtering said high frequency quadrature-modulated signal output from said frequency increasing means to generate a filtered signal; and means for amplifying said filtered signal to a level necessary for transmission through said antenna.

6. The transmission apparatus as claimed in claim 5, wherein said filtering means comprise a band pass filter.

7. A digital radio communication system including a transmission apparatus and a reception apparatus, said transmission apparatus comprising:

an antenna;

means for quadrature-modulating first and second input signals to generate a quadrature-modulated signal;

primary frequency conversion means for increasing a frequency of said quadrature-modulated signal to generate a first up-converted signal;

secondary frequency conversion means for increasing a frequency of said first up-converted signal to generate a second up-converted signal, and then supplying said second up-converted signal to said antenna;

means for generating a carrier frequency by being phase-locked in a reference frequency, and providing said carrier frequency to said quadrature-modulating means;

means for generating a primary local oscillation frequency by multiplying said carrier frequency by a first predetermined positive number, said primary local oscillation frequency driving said primary frequency conversion means; and means for generating a secondary local oscillation frequency by multiplying said carrier frequency by a second predetermined positive number, said secondary local oscillation frequency driving said secondary frequency conversion means.

8. The transmission apparatus as claimed in claim 7, wherein said primary local oscillation frequency generating means comprise:

means for multiplying said carrier frequency by said first predetermined positive number to generate a first multiplied signal;

means for filtering said first multiplied signal to generate a first filtered signal; and means for amplifying said first filtered signal to a first level to drive said primary frequency conversion means.

9. The transmission apparatus as claimed in claim 8, wherein said secondary local oscillation frequency generating means comprise:

means for multiplying said carrier frequency by said second predetermined positive number to generate a second multiplied signal;

means for filtering said second multiplied signal to generate a second filtered signal; and means for amplifying said second filtered signal to a second level to drive said secondary frequency conversion means.

10. The transmission apparatus as claimed in claim 7, further comprising means for filtering said quadrature-modulated signal to generate a first filtered signal, and then providing said first filtered signal to said primary frequency conversion means.

11. The transmission apparatus as claimed in claim 10, further comprising means for filtering said first up-converted signal to generate a second filtered signal, and then providing said second filtered signal to said secondary frequency conversion means.

12. A digital radio transmission apparatus, comprising:

digital radio signal transmission means;

means for quadrature-modulating first and second data inputs to generate a quadrature-modulated signal;

mixing means for increasing a frequency of said quadrature modulated signal to a transmission frequency band by mixing said quadrature-modulated signal with respective local oscillation frequencies in a plurality of stages;

means for generating a carrier frequency by and providing said carrier frequency to said quadrature-modulating means; and means for generating said respective local oscillation frequencies to drive said mixing means, by multiplying said carrier frequency by respective predetermined positive numbers.

13. The transmission apparatus as claimed in claim 12, wherein for each one of said plurality of stages, said means for generating said respective local oscillation frequencies comprise:

a frequency multiplier for multiplying said carrier frequency by one of said respective predetermined positive numbers to generate a multiplied signal;

a filter for extracting only necessary frequency components from said multiplied signal to generate a filtered signal; and an amplifier for amplifying said filtered signal to a level necessary to drive said mixing means.

14. The transmission apparatus as claimed in claim 13, further comprising means for filtering said quadrature-modulated signal and providing an extracted signal to said mixing means at each one of said plurality of stages.

15. The transmission apparatus as claimed in claim 12, further comprising means for filtering said quadrature-modulated signal and providing an extracted signal to said mixing means at each one of said plurality of stages.

16. The transmission apparatus as claimed in claim 12, wherein said digital radio signal transmission means comprises:

an antenna;

means for filtering said quadrature-modulated signal provided from said mixing means to generate a filtered signal; and means for amplifying said filtered signal to a level necessary for transmission through said antenna, and then supplying an output of said means for amplifying said filtered signal to a level necessary for transmission to said antenna.

17. A method for transmitting data in a digital radio communication system having transmission means and receiving means, said method comprising the steps of:

generating a carrier frequency phase-locked in a predetermined reference frequency;

quadrature-modulating first and second data input signals in dependence upon said carrier frequency to generate a quadrature-modulated signal;

multiplying said carrier frequency by a predetermined positive number to generate a local oscillation frequency signal;

increasing a frequency of said quadrature-modulated signal to generate a high frequency quadrature-modulated signal by mixing said local oscillation frequency signal with said quadrature-modulated signal;

filtering and amplifying said high frequency quadrature-modulated signal to generate a transmission signal; and transmitting said transmission signal from said transmission means to said receiving means.

18. The method for transmitting data as claimed in claim 17, further comprising a step of filtering said quadrature-modulated signal before increasing said frequency of said quadrature-modulated signal.

19. The method for transmitting data as claimed in claim 17, wherein said step of increasing said frequency of said quadrature-modulated signal is performed a plurality of times in a plurality of respective stages.

20. The method for transmitting data as claimed in claim 19, wherein each one of said plurality of respective stages comprises the steps of:

multiplying said carrier frequency by a respective predetermined positive number to generate a respective local oscillation frequency signal; and mixing said quadrature-modulated signal with said respective local oscillation frequency signal to increase said frequency of said quadrature-modulated signal.

* * * * *